(12) United States Patent
Huang et al.

(10) Patent No.: US 11,335,796 B2
(45) Date of Patent: May 17, 2022

(54) SOURCE TO CHANNEL JUNCTION FOR III-V METAL-OXIDE-SEMICONDUCTOR FIELD EFFECT TRANSISTORS (MOSFETS)

(71) Applicant: Intel Corporation, Santa Clara, CA (US)

(72) Inventors: Cheng-Ying Huang, Hillsboro, OR (US); Willy Rachmady, Beaverton, OR (US); Matthew V. Metz, Portland, OR (US); Gilbert Dewey, Hillsboro, OR (US); Sean T. Ma, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/645,758

(22) PCT Filed: Dec. 30, 2017

(86) PCT No.: PCT/US2017/069149
§ 371 (c)(1),
(2) Date: Mar. 9, 2020

(87) PCT Pub. No.: WO2019/133013
PCT Pub. Date: Jul. 4, 2019

(65) Prior Publication Data
US 2020/0287036 A1 Sep. 10, 2020

(51) Int. Cl.
*H01L 29/778* (2006.01)
*H01L 21/02* (2006.01)
(Continued)

(52) U.S. Cl.
CPC .... *H01L 29/7785* (2013.01); *H01L 21/02543* (2013.01); *H01L 21/02546* (2013.01);
(Continued)

(58) Field of Classification Search
None
See application file for complete search history.

(56) References Cited

U.S. PATENT DOCUMENTS

2010/0148153 A1   6/2010   Hudait et al.
2010/0193882 A1*  8/2010   Hoentschel ........... H01L 29/165
                                                257/410
(Continued)

FOREIGN PATENT DOCUMENTS

JP    2012-510172    4/2012

OTHER PUBLICATIONS

International Search Report and Written Opinion for International Patent Application No. PCT/US2017/069149 dated Sep. 28, 2018, 10 pgs.
(Continued)

*Primary Examiner* — Khaja Ahmad
(74) *Attorney, Agent, or Firm* — Schwabe, Williamson & Wyatt, P.C.

(57) ABSTRACT

Embodiments herein describe techniques, systems, and method for a semiconductor device. Embodiments herein may present a semiconductor device including a substrate, and a channel area above the substrate and including a first III-V material. A source area may be above the substrate and including a second III-V material. An interface between the channel area and the source area may include the first III-V material. The source area may include a barrier layer of a third III-V material above the substrate. A current is to flow between the source area and the channel area through the barrier layer. Other embodiments may be described and/or claimed.

25 Claims, 9 Drawing Sheets

(51) Int. Cl.
*H01L 29/08* (2006.01)
*H01L 29/15* (2006.01)
*H01L 29/205* (2006.01)
*H01L 29/66* (2006.01)

(52) U.S. Cl.
CPC ........ *H01L 29/0847* (2013.01); *H01L 29/158* (2013.01); *H01L 29/205* (2013.01); *H01L 29/66462* (2013.01)

(56) References Cited

U.S. PATENT DOCUMENTS

| | | |
|---|---|---|
| 2012/0139047 A1 | 6/2012 | Luo et al. |
| 2013/0154016 A1* | 6/2013 | Glass .................... H01L 29/267 257/368 |
| 2015/0162405 A1* | 6/2015 | Yang .................... H01L 29/1087 257/76 |
| 2016/0043188 A1* | 2/2016 | Chu .................... H01L 29/6659 257/72 |
| 2016/0181364 A1 | 6/2016 | Stewart et al. |
| 2016/0240646 A1 | 8/2016 | Chiu et al. |
| 2017/0047404 A1* | 2/2017 | Bentley ............. H01L 29/66795 |

OTHER PUBLICATIONS

International Search Report and Written Opinion for International Patent Application No. PCT/US2017/069149, dated Jul. 9, 2020, 7 pgs.

\* cited by examiner

SOURCE TO CHANNEL JUNCTION FOR III-V METAL-OXIDE-SEMICONDUCTOR FIELD EFFECT TRANSISTORS (MOSFETS)

CROSS-REFERENCE TO RELATED APPLICATION

This patent application is a U.S. National Phase Application under 35 U.S.C. § 371 of International Application No. PCT/US2017/069149, filed Dec. 30, 2017, entitled "SOURCE TO CHANNEL JUNCTION FOR III-V METAL-OXIDE-SEMICONDUCTOR FIELD EFFECT TRANSISTORS (MOSFETS)," which designates the United States of America, the entire disclosure of which is hereby incorporated by reference in its entirety and for all purposes.

FIELD

Embodiments of the present disclosure generally relate to the field of integrated circuits, and more particularly, to III-V metal-oxide-semiconductor field effect transistors (MOSFETs).

BACKGROUND

Traditional integrated circuits, e.g., metal-oxide-semiconductor field effect transistors (MOSFETs), may be based on silicon. On the other hand, compounds of group III-V elements may have superior semiconductor properties than silicon, including higher electron mobility and saturation velocity, leading to better performance for III-V MOSFETs. However, there may be an electron energy barrier in a source-to-channel junction for an III-V MOSFET, or simply an III-V transistor. Such an electron energy barrier may cause current choke for an III-V MOSFET, leading to reduced performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
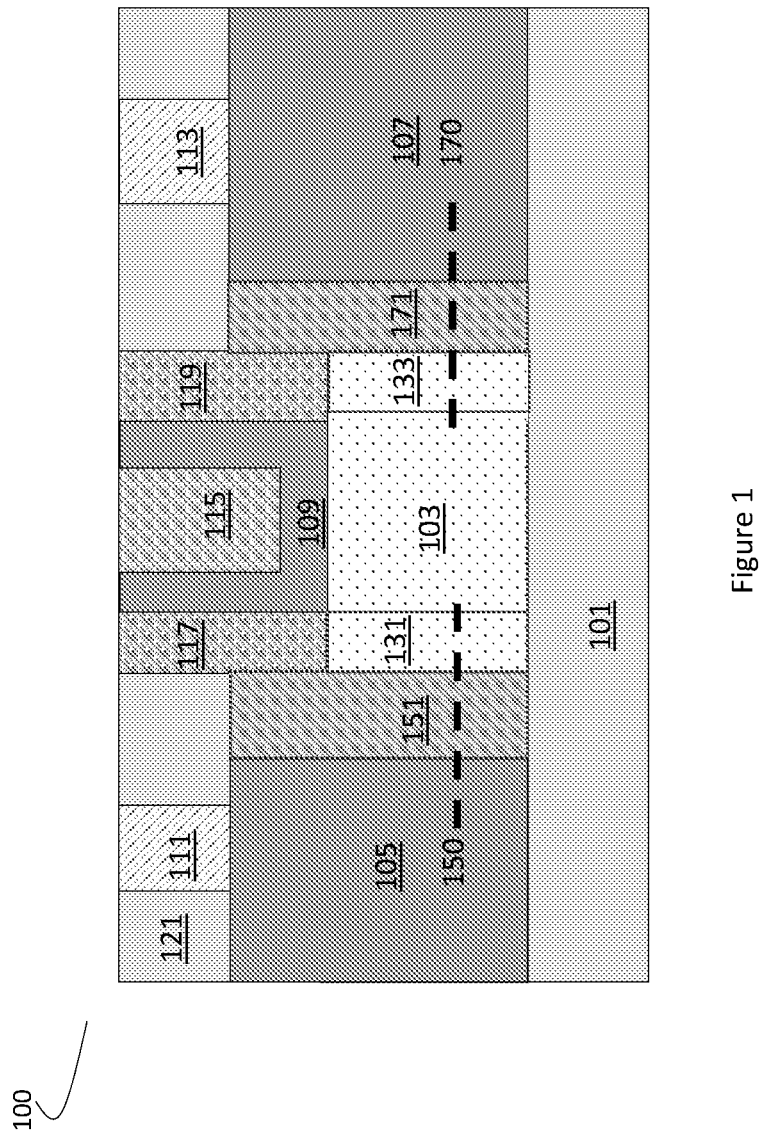
FIG. 1 schematically illustrates an example III-V metal-oxide-semiconductor field effect transistor (MOSFET) including a barrier layer within a source-to-channel junction, where a current is to flow between a source area and a channel area through the barrier layer, in accordance with some embodiments.

Compounds of group III-V elements such as gallium arsenide (GaAs), indium antimonide (InSb), indium phosphide (InP), and indium gallium arsenide (InGaAs) are known to have superior semiconductor properties than silicon, including higher electron mobility and saturation velocity. As a result, III-V metal-oxide-semiconductor field effect transistors (MOSFETs) may have better performance than silicon transistors as well. However, an electron energy barrier in a source-to-channel junction of an III-V MOSFET may cause current choke and reduced performance.

Embodiments herein may include an III-V MOSFET that may include a barrier layer within a source-to-channel junction, where a current is to flow between a source area and a channel area through the barrier layer. The barrier layer within a source-to-channel junction may smooth the electron energy barrier in a source-to-channel junction of an III-V MOSFET. As a result, the III-V MOSFET may have reduced source/drain resistance and improved performance. An III-V MOSFET may include both a source area and a drain area adjacent to a channel area. For the description below, a source area and a drain area may be used interchangeably.

Embodiments herein may present a semiconductor device including a substrate, and a channel area above the substrate and including a first III-V material. A source area may be above the substrate and including a second III-V material. An interface between the channel area and the source area may include the first III-V material. The source area may include a barrier layer of a third III-V material above the substrate. When the semiconductor device is at ON state, a current is to flow between the source area and the channel area through the barrier layer.

Embodiments herein may present a method for forming a semiconductor device. The method may include forming a channel area above a substrate, where the channel area includes a first III-V material. The method may further include forming a source area above the substrate, where the source area may include a second III-V material, and an interface between the channel area and the source area includes the first III-V material. In addition, the method may include forming a barrier layer within the source area, where the barrier layer may include a third III-V material. A current may flow between the source area and the channel area through the barrier layer.

Embodiments herein may present a computing device. The computing device may include a processor and a memory device coupled to the processor. The memory device or the processor may include a transistor. The transistor may include a substrate, and a channel area above the substrate and including a first III-V material. A source area may be above the substrate and including a second III-V material. An interface between the channel area and the source area may include the first III-V material. The source area may include a barrier layer of a third III-V material above the substrate. A current may flow between the source area and the channel area through the barrier layer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates an example III-V MOSFET 100 including a barrier layer 151 within a source-to-channel junction, where a current is to flow between a source area 105 and a channel area 103 through the barrier layer 151, in accordance with some embodiments. For clarity, features of the III-V MOSFET 100, the barrier layer 151, the source area 105, and the channel area 103, may be described below as examples for understanding an III-V MOSFET, a barrier layer, a source area, and a channel area. Further, it is to be understood that one or more of the components of an III-V MOSFET, a barrier layer, a source area, and a channel area may include additional and/or varying features from the description below, and may include any device that one having ordinary skill in the art would consider and/or refer to as an III-V MOSFET, a barrier layer, a source area, and a channel area.

In embodiments, the III-V MOSFET 100 may include a substrate 101. The channel area 103 may be above the substrate 101. The source area 105 may be above the substrate 101 and adjacent to the channel area 103 with an interface 131. In addition, the source area 105 may include the barrier layer 151. A source electrode 111 may be coupled to the source area 105. The III-V MOSFET 100 may further include a drain area 107 above the substrate 101 and adjacent to the channel area 103 with an interface 133. The drain area 107 may include a barrier layer 171. A drain electrode 113 may be coupled to the drain area 107. A high-k gate dielectric layer 109 may be on the channel area 103. A gate electrode 115 may be separated from the channel area 103 by the high-k gate dielectric layer 109. A spacer 117 may be between the source electrode 111 and the gate electrode 115, and a spacer 119 may be between the drain electrode 113 and the gate electrode 115. Furthermore, the source electrode 111, the drain electrode 113, and the gate electrode 115 may be within an ILD layer 121.

Figure 2:
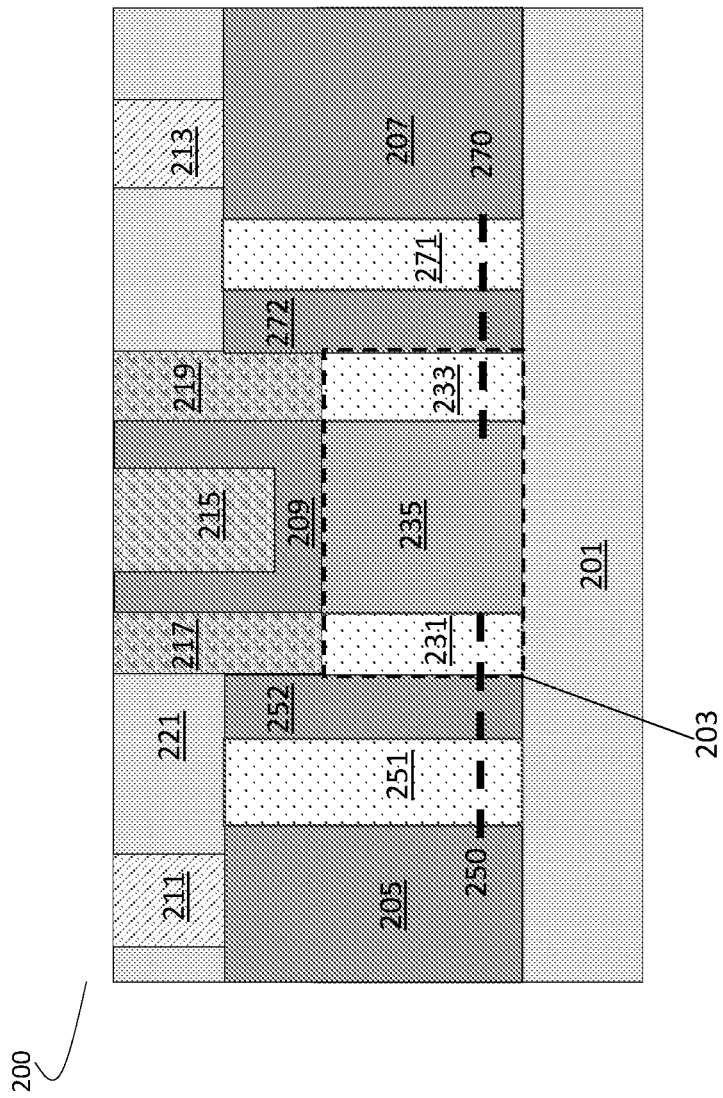
FIG. 2 schematically illustrates another example III-V MOSFET including a barrier layer, where a current is to flow between a source area and a channel area through the barrier layer, in accordance with some embodiments.

In embodiments, the channel area 103 may include a first III-V material. In particular, the first III-V material may be included in the interface 131 or the interface 133. In some embodiments, the channel area 103 may include the first III-V material only, as shown in FIG. 1. In some other embodiments, the channel area 103 may include additional III-V material, as shown in FIG. 2. The first III-V material may include indium (In), phosphorus (P), gallium (Ga), or arsenic (As).

The source area 105 or the drain area 107 may include a second III-V material, which may include In, As, or Ga. In addition, the source area 105 or the drain area 107 may include dopant, e.g., an n-type dopant. There may be a large conduction band offset (CBO) between the second III-V material included in the source area 105 or the drain area 107 and the first III-V material included in the interface 131 or the interface 133. For example, when the second III-V material includes InGaAs, and the first III-V material includes InP, there may be a CBO of 0.25 eV between InGaAs included in the source area 105 and InP included in the interface 131. In addition, when the second III-V material includes InAs, and the first III-V material includes InP, there may be a CBO of 0.45 eV between InAs included in the source area 105 and InP included in the interface 131.

A large CBO between the first III-V material included in the interface 131 and the second III-V material included in the source area 105 may cause a current choke for the source-to-channel junction including the source area 105 and the channel area 103. A large current choke for the source-to-channel junction may lead to large resistance between the source area 105 and the channel area 103. The barrier layer 151 may be used to smooth the current choke for the source-to-channel junction including the source area 105 and the channel area 103 and to improve the performance for the III-V MOSFET 100. When the III-V MOSFET 100 is at ON state, a current 150 may flow between the source area 105 and the channel area 103 through the barrier layer 151. Similarly, the barrier layer 171 may smooth the current choke for the drain-to-channel junction including the drain area 107 and the channel area 103. When the III-V MOSFET 100 is at ON state, a current 170 may flow between the drain area 107 and the channel area 103 through the barrier layer 171.

Figure 3:
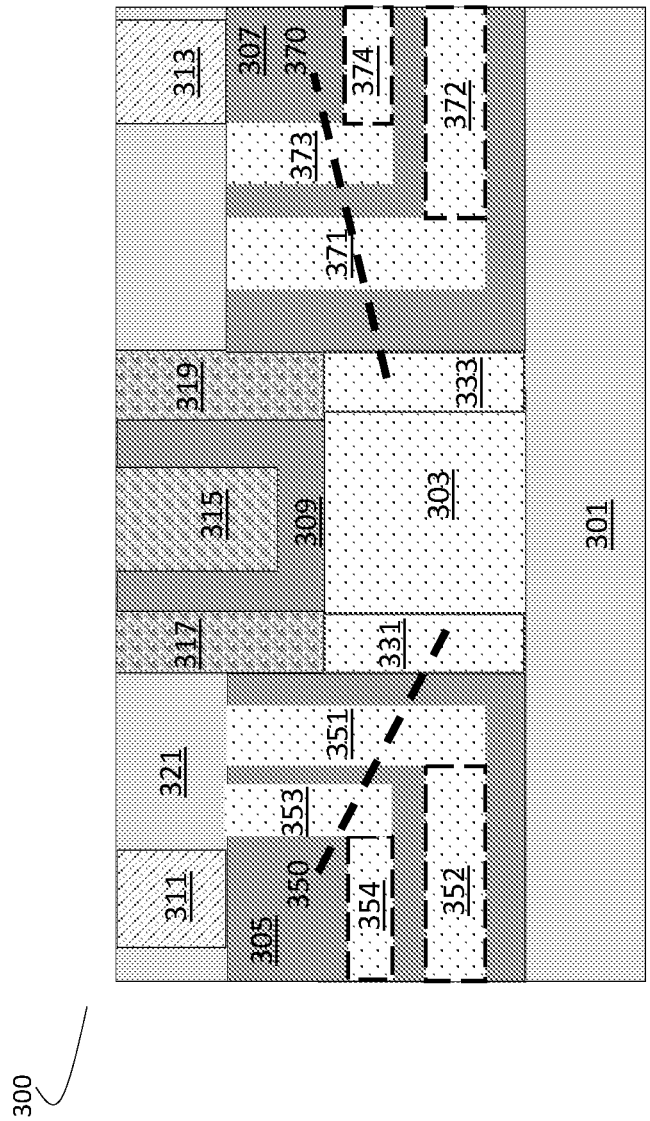
FIG. 3 schematically illustrates an example III-V MOSFET including multiple barrier layers, where a current is to flow between a source area and a channel area through the multiple barrier layers, in accordance with some embodiments.

In embodiments, the barrier layer 151 and the barrier layer 171 may include a third III-V material, which may include In, P, Ga, or As. In some embodiments, the third III-V material included in the barrier layer 151 and the barrier layer 171 may be different from the first III-V material included in the interface 131 or the interface 133, as shown in FIG. 1. In some other embodiments, the third III-V material included in the barrier layer 151 and the barrier layer 171 may be a same as the first III-V material included in the interface 131 or the interface 133, as shown in FIG. 2 or FIG. 3.

In embodiments, the barrier layer 151 and the barrier layer 171 may include a vertical part in parallel with a sidewall of the channel area 103. In some embodiments, the barrier layer 151 and the barrier layer 171 may be adjacent to the sidewall of the channel area 103, as shown in FIG. 1. Different configurations for the barrier layer 151 and the barrier layer 171 may be shown in FIG. 2 or FIG. 3.

In some embodiments, the high-k gate dielectric layer 109 may include a high-k dielectric material. For example, the high-k gate dielectric layer 109 may include a material with a dielectric constant of at least about 10. In detail, the high-k gate dielectric layer 109 may include $Al_2O_3$, although other materials such as $La_2O_3$, $HfO_2$, $ZrO_2$, or ternary complexes such as $LaAl_xO_y$, $Hf_xZr_yO_z$ may be used in other embodiments.

In embodiments, the source electrode 111, the drain electrode 113, or the gate electrode 115 may be formed as a single layer or a stacked layer using one or more conductive films including a conductive material. For example, the source electrode 111, the drain electrode 113, or the gate electrode 115 may include a metallic material, a conductive polymer, a polysilicon, a titanium silicide, a phosphorus (n+) doped Si, a boron doped SiGe, or an alloy of a semiconductor material and a metal. For example, the source electrode 111, the drain electrode 113, or the gate electrode 115 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. The source electrode 111, the drain electrode 113, or the gate electrode 115 may include tantalum nitride (TaN), titanium nitride (TiN), iridium-tantalum alloy (Ir—Ta), indium-tin oxide (ITO), the like, and/or a combination thereof.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, or AlN. The substrate includes a high-resistivity p-type or n-type vicinal silicon material, germanium, germanium on silicon, gallium arsenide (GaAs), a silicon-on-insulator substrate, a Ge-on-insulator substrate, or an III-V on insulator substrate.

FIG. 2 schematically illustrates another example III-V MOSFET 200 including a barrier layer 251, where a current is to flow between a source area 205 and a channel area 203 through the barrier layer 251, in accordance with some embodiments. In embodiments, the III-V MOSFET 200, the barrier layer 251, the source area 205, and the channel area 203, may be similar to the III-V MOSFET 100, the barrier layer 151, the source area 105, and the channel area 103, respectively, as shown in FIG. 1.

In embodiments, the III-V MOSFET 200 may include a substrate 201. The channel area 203 may be above the substrate 201. The source area 205 may be above the substrate 201 and adjacent to the channel area 203 with an interface 231. In addition, the source area 205 may include the barrier layer 251. A source electrode 211 may be coupled to the source area 205. The III-V MOSFET 200 may further include a drain area 207 above the substrate 201 and adjacent to the channel area 203 with an interface 233. The drain area 207 may include a barrier layer 271. A drain electrode 213 may be coupled to the drain area 207. A high-k gate dielectric layer 209 may be on the channel area 203. A gate electrode 215 may be separated from the channel area 203 by the high-k gate dielectric layer 209. A spacer 217 may be between the source electrode 211 and the gate electrode 215, and a spacer 219 may be between the drain electrode 213 and the gate electrode 215. Furthermore, the source electrode 211, the drain electrode 213, and the gate electrode 215 may be within an ILD layer 221.

In embodiments, the interface 231 or the interface 233 of the channel area 203 may include a first III-V material, which may include In, P, Ga, or As. In addition, the channel area 203 may include additional III-V material in an area 235 next to the interface 231 and the interface 233, where the interface 231 or the interface 233 may be an outer area of the channel area 203. In addition, the source area 205 or the drain area 207 may include a second III-V material, which may include In, As, or Ga. Furthermore, the source area 205 or the drain area 207 may include dopant, e.g., an n-type dopant.

In embodiments, the barrier layer 251 and the barrier layer 271 may include a third III-V material, which may include In, P, Ga, or As. In some embodiments, the third III-V material included in the barrier layer 251 and the barrier layer 271 may be a same as the first III-V material included in the interface 231 or the interface 233. The barrier layer 251 and the barrier layer 271 may include a vertical part in parallel with a sidewall of the channel area 203. In addition, the barrier layer 251 may be separated from the sidewall of the channel area 203 by an area 252 of the source area 205, which may be a quantum well between the barrier layer 251 and the interface 231. Similarly, the barrier layer 271 may be separated from the sidewall of the channel area 203 by an area 272 of the drain area 207, which may be a quantum well between the barrier layer 271 and the interface 233. When the III-V MOSFET 200 is at ON state, a current 250 may flow between the source area 205 and the channel area 203 through the barrier layer 251. Similarly, a current 270 may flow between the drain area 207 and the channel area 203 through the barrier layer 271.

FIG. 3 schematically illustrates an example III-V MOSFET 300 including multiple barrier layers, e.g., a barrier layer 351, a barrier layer 353, where a current is to flow between a source area 305 and a channel area 303 through the multiple barrier layers, in accordance with some embodiments. In embodiments, the III-V MOSFET 300, the barrier layer 351, the barrier layer 353, the source area 305, and the channel area 303, may be similar to the III-V MOSFET 100, the barrier layer 151, the source area 105, and the channel area 103, respectively, as shown in FIG. 1.

In embodiments, the III-V MOSFET 300 may include a substrate 301. The channel area 303 may be above the substrate 301. The source area 305 may be above the substrate 301 and adjacent to the channel area 303 with an interface 331. In addition, the source area 305 may include the barrier layer 351 and the barrier layer 353. A source electrode 311 may be coupled to the source area 305. The III-V MOSFET 300 may further include a drain area 307 above the substrate 301 and adjacent to the channel area 303 with an interface 333. The drain area 307 may include a barrier layer 371 and a barrier layer 373. A drain electrode 313 may be coupled to the drain area 307. A high-k gate dielectric layer 309 may be on the channel area 303. A gate electrode 315 may be separated from the channel area 303 by the high-k gate dielectric layer 309. A spacer 317 may be between the source electrode 311 and the gate electrode 315, and a spacer 319 may be between the drain electrode 313 and the gate electrode 315. Furthermore, the source electrode 311, the drain electrode 313, and the gate electrode 315 may be within an ILD layer 321.

In embodiments, the interface 331 or the interface 333 of the channel area 303 may include a first III-V material, which may include In, P, Ga, or As. The channel area 303 may include only the first III-V material. Additionally and alternatively, the channel area 303 may include additional III-V material next to the interface 331 and the interface 333, not shown. The source area 305 or the drain area 307 may include a second III-V material, which may include In, As, or Ga. In addition, the source area 305 or the drain area 307 may include dopant, e.g., an n-type dopant.

In embodiments, the barrier layer 351, the barrier layer 353, the barrier layer 371, and the barrier layer 373, may include a third III-V material, which may include In, P, Ga, or As. In some embodiments, the third III-V material included in the barrier layer 351, the barrier layer 353, the barrier layer 371, and the barrier layer 373, may be a same as the first III-V material included in the interface 331 or the interface 333. Quantum wells may be formed between the interface 331 and the barrier layer 351, the barrier layer 351 and the barrier layer 353, the interface 333 and the barrier layer 371, the barrier layer 371 and the barrier layer 373.

When the III-V MOSFET 300 is at ON state, a current 350 may flow between the source area 305 and the channel area 303 through the barrier layer 351 and the barrier layer 353. Similarly, a current 370 may flow between the drain area 307 and the channel area 303 through the barrier layer 371 and the barrier layer 373.

The barrier layer 351, the barrier layer 353, the barrier layer 371, and the barrier layer 373 may include a vertical part in parallel with a sidewall of the channel area 303. In addition, the barrier layer 351, the barrier layer 353, the barrier layer 371, and the barrier layer 373 may include a horizontal part 352, a horizontal part 354, a horizontal part 372, and a horizontal part 374, respectively. The horizontal part 352, the horizontal part 354, the horizontal part 372, and the horizontal part 374, may be in parallel to a surface of the substrate 301, and substantially orthogonal to the vertical part of the barrier layer 351, the barrier layer 353, the barrier layer 371, and the barrier layer 373, respectively.

The barrier layer 151, the barrier layer 171, the barrier layer 251, the barrier layer 271, the barrier layer 351, the barrier layer 353, the barrier layer 371, and the barrier layer 373, shown in FIGS. 1-3, are merely examples of barrier layers within a source-to-channel junction. There may be other barrier layers of different shapes or sizes within a source-to-channel junction. When a current is to flow between a source area and a channel area through one or more barrier layers, the resistances may be reduced, and the performance of the III-V MOSFET may be improved.

Figure 4:
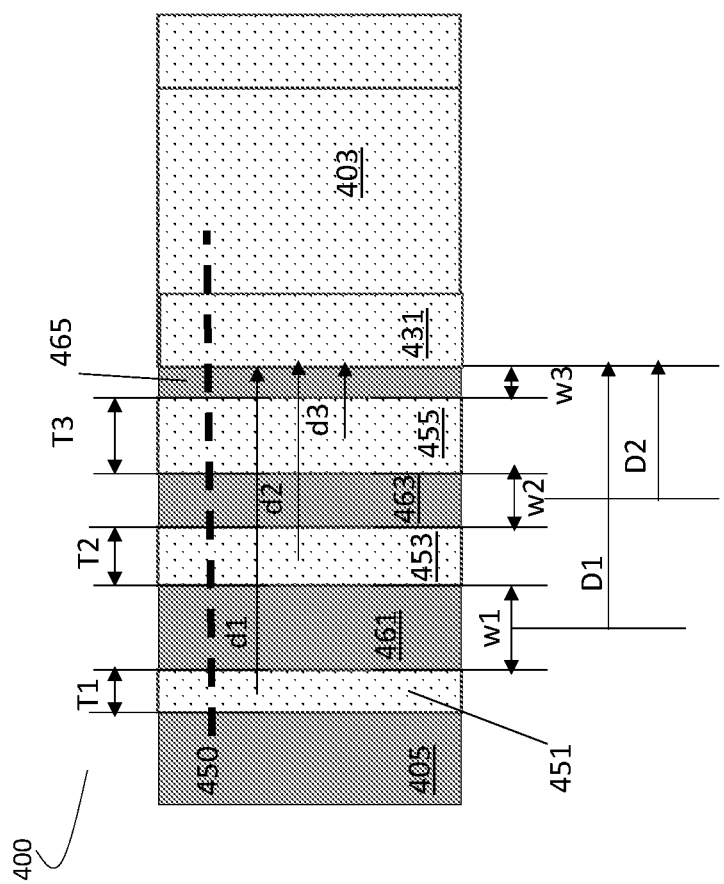
FIG. 4 schematically illustrates an example source-to-channel junction of an III-V MOSFET including a sequence of barrier layers within a source area, in accordance with some embodiments.

FIG. 4 schematically illustrates an example source-to-channel junction 400 of an III-V MOSFET including a sequence of barrier layers, e.g., a barrier layer 451, a barrier layer 453, and a barrier layer 455, within a source area 405, in accordance with some embodiments. In embodiments, the source-to-channel junction 400 including the source area 405 and a channel area 403 may be similar to the source area 105 and the channel area 103 as shown in FIG. 1. In addition, any one of the barrier layer 451, the barrier layer 453, and the barrier layer 455, may be similar to the barrier layer 151. A current 450 may flow between the source area 405 and the channel area 403 through the sequence of barrier layers, e.g., the barrier layer 451, the barrier layer 453, and the barrier layer 455.

In embodiments, the barrier layer 451 may have a thickness T1, the barrier layer 453 may have a thickness T2, and the barrier layer 455 may have a thickness T3. The barrier layer 451 may have a distance d1 to the channel area 403, the barrier layer 453 may have a distance d2 to the channel area 403, and the barrier layer 455 may have a distance d3 to the channel area 403. A distance from a barrier layer to the channel area 403 may be measured from a center of the barrier layer to an edge of the channel area 403. Other formats of measurements may be used in other embodiments.

The barrier layer 451, the barrier layer 453, and material in between may form a quantum well 461; the barrier layer 453, the barrier layer 455, and material in between may form a quantum well 463; while the barrier layer 455, the channel area 403 or an interface 431 of the channel 403, and material in between may form a quantum well 465. The quantum well 461 may have a width w1, the quantum well 463 may have a width w2, and the quantum well 465 may have a width w3. In addition, the quantum well 461 may have a distance D1 to the channel area 403, and the quantum well 463 may have a distance D2 to the channel area 403, while the quantum well 465 may be next to the channel area 403 without a distance.

The barrier layer 451 may have a longest distance to the channel area 403, e.g., d1>d2, and d1>d3. The barrier layer 455 may have a shortest distance to the channel area 403, e.g., d1>d3 and d2>d3. In embodiments, the thickness T1 may be smaller than the thickness T2, which may be further smaller than the thickness T3. On the other hand, the width w1 may be larger than the width w2, which may be further larger than the width w3.

In general, for any sequence of barrier layers within the source area 405, a first barrier layer in the sequence of barrier layers, e.g., the barrier layer 451, may have a smaller thickness than a second barrier layer in the sequence of barrier layers, e.g., the barrier layer 453, when the first barrier layer has a longer distance to the channel area than the second barrier layer, e.g., d1>d2. On the other hand, a first quantum well between two barrier layers in the sequence of barrier layers, e.g., the quantum well 461, may have a larger width than a second quantum well, e.g., the quantum well 463, when the first quantum well has a longer distance to the channel area than the second quantum well.

Figure 5A:
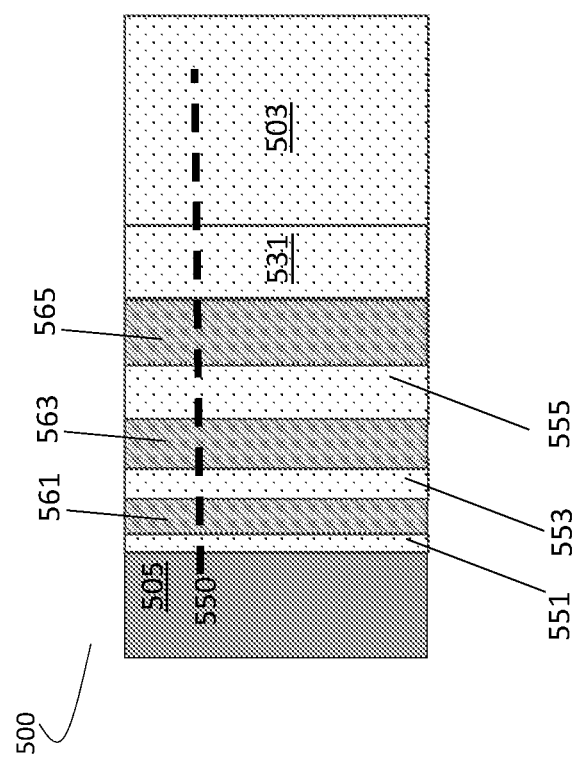
FIGS. 5(*a*)-5(*b*) schematically illustrate example source-to-channel junctions of an III-V MOSFET including two sequences of barrier layers within a source area, in accordance with some embodiments.
Figure 5B:
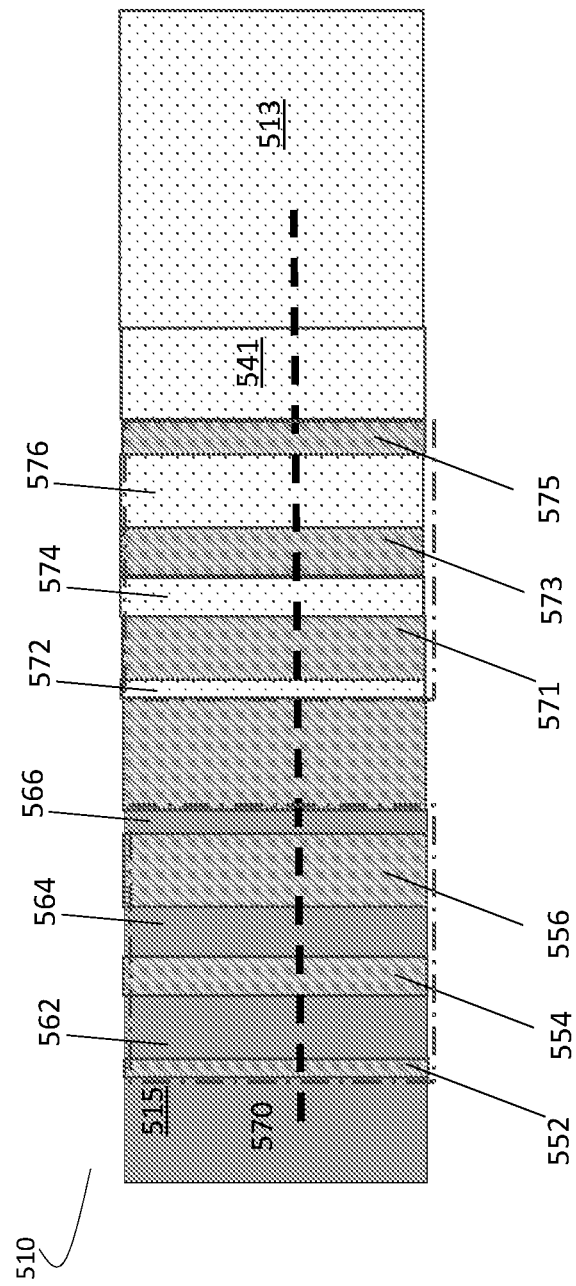

FIGS. 5(a)-5(b) schematically illustrate example source-to-channel junctions of an III-V MOSFET including two sequences of barrier layers within a source area, in accordance with some embodiments.

FIG. 5(a) schematically illustrates an example source-to-channel junction 500 of an III-V MOSFET including two interleaving sequences of barrier layers within a source area, in accordance with some embodiments. The source-to-channel junction 500 may include a source area 505 and a channel area 503 with an interface 531. A first sequence of barrier layers, e.g., a barrier layer 551, a barrier layer 553, and a barrier layer 555, may be interleaved with a second sequence of barrier layers, e.g., a barrier layer 561, a barrier layer 563, and a barrier layer 565. In embodiments, the first sequence of barrier layers, or the second sequence of barrier layers may be similar to the sequence of barrier layers including the barrier layer 451, the barrier layer 453, and the barrier layer 455, as shown in FIG. 4. In embodiments, the source-to-channel junction 500 including the source area 505 and a channel area 503 may be similar to the source area 105 and the channel area 103 as shown in FIG. 1.

In embodiments, the channel area 503 and the interface 531 may include a first III-V material, which may include In, P, Ga, or As. The source area 505 may include a second III-V material, which may include In, As, or Ga. The first sequence of barrier layers, e.g., the barrier layer 551, the barrier layer 553, and the barrier layer 555, may include the first III-V material, while the second sequence of barrier layers, e.g., the barrier layer 561, the barrier layer 563, and the barrier layer 565 may include a third III-V material different from the first III-V material. For example, the first III-V material may include InP, the second III-V material may include InAs, while the third III-V material may include InGaAs. A current 550 may flow between the source area 505 and the channel area 503 through the first sequence of barrier layers, e.g., the barrier layer 551, the barrier layer 553, and the barrier layer 555, and also through the second sequence of barrier layers, e.g., the barrier layer 561, the barrier layer 563, and the barrier layer 565.

FIG. 5(b) schematically illustrates an example source-to-channel junction 510 of an III-V MOSFET including two sequences of barrier layers within a source area, in accordance with some embodiments. The source-to-channel junction 510 may include a source area 515 and a channel area 513 with an interface 541. A first sequence of barrier layers may include a barrier layer 552, a barrier layer 554, and a barrier layer 556. A second sequence of barrier layers may include a barrier layer 572, a barrier layer 574, and a barrier layer 576. In embodiments, the first sequence of barrier layers, or the second sequence of barrier layers may be similar to the sequence of barrier layers including the barrier layer 451, the barrier layer 453, and the barrier layer 455, as shown in FIG. 4. In embodiments, the source-to-channel junction 510 including the source area 515 and a channel area 513 may be similar to the source area 105 and the channel area 103 as shown in FIG. 1. Multiple quantum wells, e.g., a quantum well 562, a quantum well 564, a quantum well 566, a quantum well 571, a quantum well 573, and a quantum well 575, may be formed between a pair of barrier layers.

In embodiments, the channel area 513 and the interface 541 may include a first III-V material, which may include In, P, Ga, or As. The source area 515 may include a second III-V material, which may include In, As, or Ga. The first sequence of barrier layers, e.g., the barrier layer 572, the barrier layer 574, and the barrier layer 576 may include the first III-V material, while the second sequence of barrier layers, e.g., the barrier layer 552, the barrier layer 554, and the barrier layer 556, may include a third III-V material different from the first III-V material. For example, the first III-V material may include InP, the second III-V material may include InAs, while the third III-V material may include InGaAs. A current 570 may flow between the source area 515 and the channel area 513 through the first sequence of barrier layers, e.g., the barrier layer 572, the barrier layer 574, and the barrier layer 576, and also through the second sequence of barrier layers, e.g., the barrier layer 552, the barrier layer 554, and the barrier layer 556.

Each barrier layer of the second sequence of barrier layers, e.g., the barrier layer 552, the barrier layer 554, and the barrier layer 556, may have a longer distance to the channel area 513 than each barrier layer of the first sequence of barrier layers, e.g., the barrier layer 572, the barrier layer 574, and the barrier layer 576.

Figure 6:
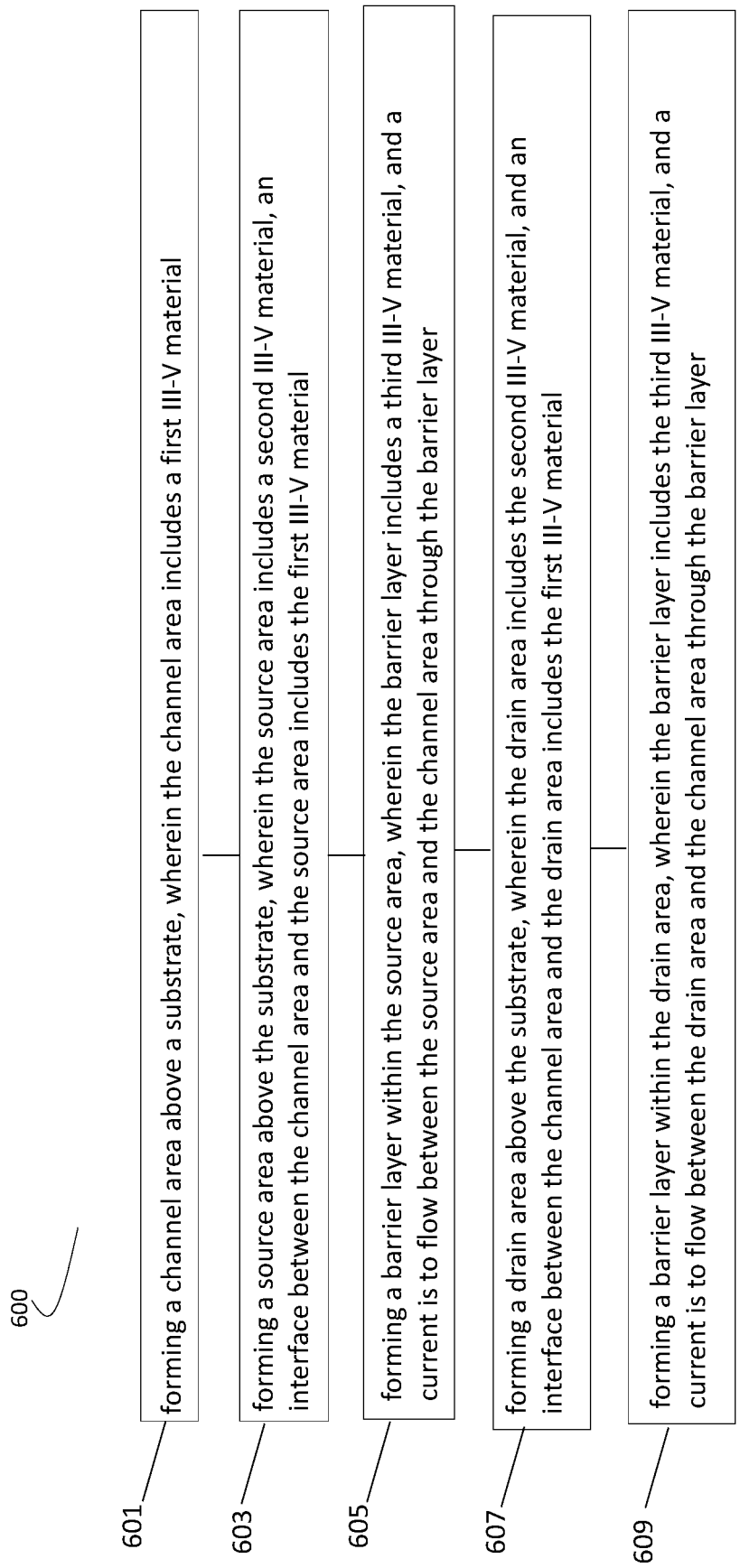
FIG. 6 illustrates an example process for forming an III-V MOSFET including a barrier layer, where a current is to flow between a source area and a channel area through the barrier layer, in accordance with some embodiments.

FIG. 6 illustrates a process 600 for forming an III-V MOSFET including a barrier layer, where a current is to flow between the source area and the channel area through the barrier layer, in accordance with some embodiments. In embodiments, the process 600 may be used to form the III-V MOSFET 100, the III-V MOSFET 200, or the III-V MOSFET 300, as shown in FIGS. 1-3.

At block 601, the process 600 may include forming a channel area above a substrate, wherein the channel area includes a first III-V material. For example, as shown in FIG. 1, the process 600 may include forming the channel area 103 above the substrate 101, wherein the channel area 103 may include a first III-V material.

At block 603, the process 600 may include forming a source area above the substrate, wherein the source area includes a second III-V material, an interface between the channel area and the source area includes the first III-V material. For example, as shown in FIG. 1, the process 600 may include forming the source area 105 above the substrate 101, wherein the source area 105 may include a second III-V material. The interface 131 between the channel area 103 and the source area 105 may include the first III-V material.

At block 605, the process 600 may include forming a barrier layer within the source area, wherein the barrier layer includes a third III-V material, and a current is to flow between the source area and the channel area through the barrier layer. For example, as shown in FIG. 1, the process 600 may include forming the barrier layer 151 within the source area 105. The barrier layer 151 may include a third III-V material, and the current 150 is to flow between the source area 105 and the channel area 103 through the barrier layer 151.

At block 607, the process 600 may include forming a drain area above the substrate, wherein the drain area includes the second III-V material, and an interface between the channel area and the drain area includes the first III-V material. For example, as shown in FIG. 1, the process 600 may include forming the drain area 107 above the substrate 101, where the drain area 107 may include the second III-V material. The interface 133 between the channel area 103 and the drain area 107 may include the first III-V material.

At block 609, the process 600 may include forming a barrier layer within the drain area, wherein the barrier layer includes the third III-V material, and a current is to flow between the drain area and the channel area through the barrier layer. For example, as shown in FIG. 1, the process 600 may include forming the barrier layer 171 within the drain area 107, where the barrier layer 171 may include the third III-V material. The current 170 may flow between the drain area 107 and the channel area 103 through the barrier layer 171.

Figure 7:
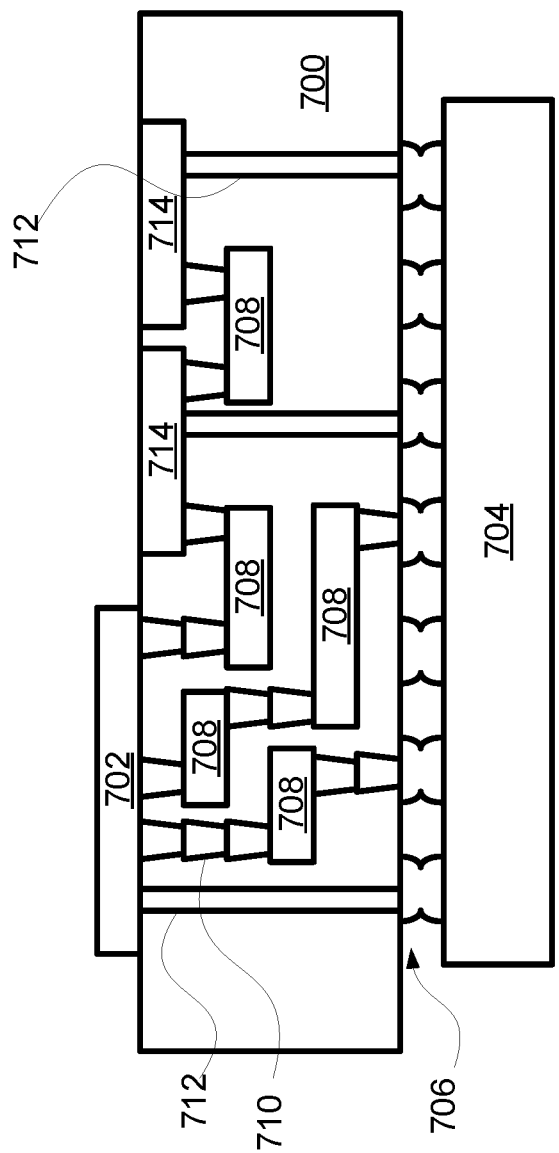
FIG. 7 schematically illustrates an interposer implementing one or more embodiments of the disclosure, in accordance with some embodiments.

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support the III-V MOSFET 100 including the barrier layer 151 within the source area 105, where the current 150 is to flow between the source area 105 and the channel area 103 through the barrier layer 151, shown in FIG. 1. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
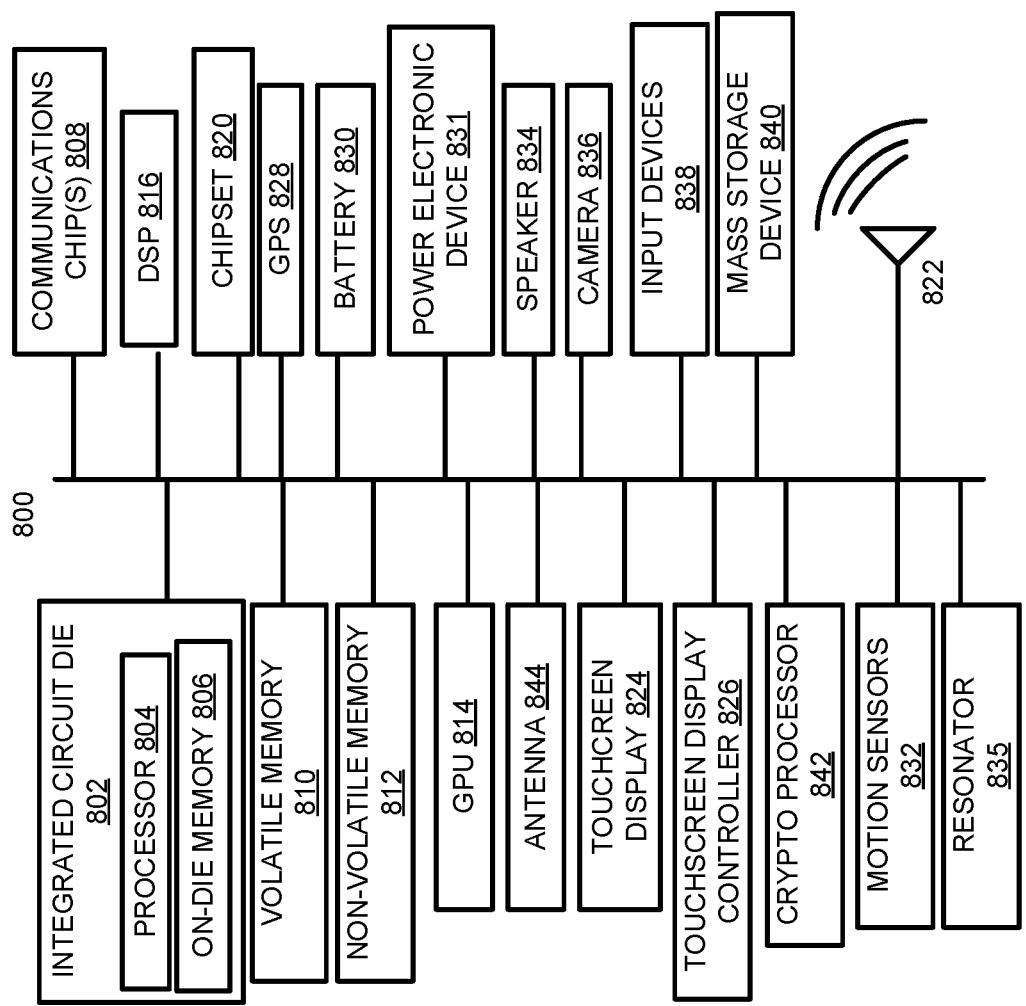
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the processor 804 or the on-die memory 806, or other control circuits in the integrated circuit die 802 may include the III-V MOSFET 100 including the barrier layer 151 within the source area 105, where the current 150 is to flow between the source area 105 and the channel area 103 through the barrier layer 151, shown in FIG. 1, the III-V MOSFET 200, the III-V MOSFET 300 shown in FIGS. 2-3, or an III-V MOSFET fabricated following the process 600 shown in FIG. 6.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (μLED) display, or others.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power electronic device 831, a voltage regulator (not shown), a global positioning system (GPS) device 828, a compass, a motion coprocessor or sensors 832 (that may include an accelerometer, a gyroscope, and a compass), a microphone (not shown), a speaker 834, a resonator 835, a camera 836, user input devices 838 (such as a keyboard, mouse, stylus, and touchpad), and a mass storage device 840 (such as hard disk drive, compact disk (CD), digital versatile disk (DVD), and so forth). In embodiments, various components may include the III-V MOSFET 100 including the barrier layer 151 within the source area 105, where the current 150 is to flow between the source area 105 and the channel area 103 through the barrier layer 151, shown in FIG. 1, the III-V MOSFET 200, the III-V MOSFET 300 shown in FIGS. 2-3, or an III-V MOSFET fabricated following the process 600 shown in FIG. 6.

The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

In further embodiments, another component housed within the computing device 800 may contain one or more devices, such as the power electronic device 831, that are formed in accordance with implementations of the current disclosure, e.g., the III-V MOSFET 100 including the barrier layer 151 within the source area 105, where the current 150 is to flow between the source area 105 and the channel area 103 through the barrier layer 151, shown in FIG. 1, the III-V MOSFET 200, the III-V MOSFET 300 shown in FIGS. 2-3, or an III-V MOSFET fabricated following the process 600 shown in FIG. 6.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are provided below.

Example 1 may include a semiconductor device, comprising: a substrate; a channel area above the substrate and including a first III-V material; and a source area above the substrate and including a second III-V material, wherein an interface between the channel area and the source area includes the first III-V material, the source area includes a barrier layer of a third III-V material above the substrate, and a current is to flow between the source area and the channel area through the barrier layer.

Example 2 may include the semiconductor device of example 1 and/or some other examples herein, wherein the barrier layer includes a vertical part in parallel with a sidewall of the channel area.

Example 3 may include the semiconductor device of example 2 and/or some other examples herein, wherein the barrier layer further includes a horizontal part in parallel to a surface of the substrate, and substantially orthogonal to the vertical part.

Example 4 may include the semiconductor device of example 3 and/or some other examples herein, further comprising: a source electrode coupled to the source area; a drain area above the substrate and including the second III-V material, wherein an interface between the channel area and the drain area includes the first III-V material, the drain area includes a barrier layer of the third III-V material above the substrate, and a current is to flow between the drain area and the channel area through the barrier layer; a drain electrode coupled to the drain area; a high-k gate dielectric layer on the channel area; and a gate electrode separated from the channel area by the high-k gate dielectric layer.

Example 5 may include the semiconductor device of any one of examples 1-2 and/or some other examples herein, wherein the source area further includes a sequence of barrier layers of the third III-V material, the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

Example 6 may include the semiconductor device of any one of examples 1-2 and/or some other examples herein, wherein the third III-V material is different from the first III-V material, the source area further includes a first sequence of barrier layers of the first III-V material and a second sequence of barrier layers of the third III-V material, the first sequence of barrier layers of the first III-V material interleaving with the second sequence of barrier layers of the third III-V material, and the current is to flow between the source area and the channel area through the first sequence of barrier layers and the second sequence of barrier layers.

Example 7 may include the semiconductor device of any one of examples 1-2 and/or some other examples herein, wherein the third III-V material is different from the first III-V material, the source area further includes a first sequence of barrier layers of the first III-V material and a second sequence of barrier layers of the third III-V material, each barrier layer of the second sequence of barrier layers of the third III-V material has a longer distance to the channel area than each barrier layer of the first sequence of barrier layers of the first III-V material, and the current is to flow between the source area and the channel area through the first sequence of barrier layers and the second sequence of barrier layers.

Example 8 may include the semiconductor device of any one of examples 1-2 and/or some other examples herein, wherein the channel area includes the first III-V material as an outer area of the channel area, and a fourth III-V material next to the first III-V material.

Example 9 may include the semiconductor device of any one of examples 1-2 and/or some other examples herein, wherein the channel area includes the first III-V material only.

Example 10 may include the semiconductor device of any one of examples 1-2 and/or some other examples herein, wherein the third III-V material is the same as the first III-V material.

Example 11 may include the semiconductor device of any one of examples 1-2 and/or some other examples herein, the first III-V material or the third III-V material includes indium (In), phosphorus (P), gallium (Ga), or arsenic (As).

Example 12 may include the semiconductor device of any one of examples 1-2 and/or some other examples herein, wherein the source area includes n-type dopant.

Example 13 may include the semiconductor device of any one of examples 1-2 and/or some other examples herein, wherein the source area includes In, As, or Ga.

Example 14 may include the semiconductor device of any one of examples 1-2 and/or some other examples herein, wherein the substrate includes a high-resistivity p-type or n-type vicinal silicon material, germanium, germanium on silicon, gallium arsenide (GaAs), a silicon-on-insulator substrate, a Ge-on-insulator substrate, or an III-V on insulator substrate.

Example 15 may include a method for forming a semiconductor device, the method comprising: forming a channel area above a substrate, wherein the channel area includes a first III-V material; forming a source area above the substrate, wherein the source area includes a second III-V material, an interface between the channel area and the source area includes the first III-V material; and forming a barrier layer within the source area, wherein the barrier layer includes a third III-V material, and a current is to flow between the source area and the channel area through the barrier layer.

Example 16 may include the method of example 15 and/or some other examples herein, wherein the barrier layer includes a vertical part in parallel with a sidewall of the channel area.

Example 17 may include the method of example 15 and/or some other examples herein, further comprising: forming a drain area above the substrate, wherein the drain area includes the second III-V material, and an interface between the channel area and the drain area includes the first III-V material, and forming a barrier layer within the drain area, wherein the barrier layer includes the third III-V material, and a current is to flow between the drain area and the channel area through the barrier layer.

Example 18 may include the method of example 17 and/or some other examples herein, further comprising: forming a high-k gate dielectric layer on the channel area; forming a gate electrode separated from the channel area by the high-k gate dielectric layer; forming a source electrode coupled to the source area; and forming a drain electrode coupled to the drain area.

Example 19 may include the method of any one of examples 15-16 and/or some other examples herein, further comprising: forming a sequence of barrier layers of the third III-V material within the source area, wherein the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

Example 20 may include the method of any one of examples 15-16 and/or some other examples herein, wherein the third III-V material is different from the first III-V material, and the method further includes: forming a first sequence of barrier layers of the first III-V material within the source area; and forming a second sequence of barrier layers of the third III-V material within the source area, wherein the current is to flow between the source area and the channel area through the first sequence of barrier layers and the second sequence of barrier layers.

Example 21 may include the method of any one of examples 15-16 and/or some other examples herein, wherein the first III-V material, or the third III-V material includes In, P, Ga, or As.

Example 22 may include a computing device, comprising: a processor; and a memory device coupled to the processor, wherein the memory device or the processor includes a transistor comprising: a substrate; a channel area above the substrate and including a first III-V material; and a source area above the substrate and including a second III-V material, wherein an interface between the channel area and the source area includes the first III-V material, the source area includes a barrier layer of a third III-V material above the substrate, and a current is to flow between the source area and the channel area through the barrier layer.

Example 23 may include the computing device of example 22 and/or some other examples herein, wherein the source area further includes a sequence of barrier layers of the third III-V material, the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

Example 24 may include the computing device of any one of examples 22-23 and/or some other examples herein, wherein the third III-V material is different from the first III-V material, the source area further includes a first sequence of barrier layers of the first III-V material and a second sequence of barrier layers of the third III-V material, and the current is to flow between the source area and the channel area through the first sequence of barrier layers and the second sequence of barrier layers.

Example 25 may include the computing device of any one of examples 22-23 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

Example 26 may include one or more computer-readable media having instructions for forming a semiconductor device, upon execution of the instructions by one or more processors, to perform the method of any one of examples 15-21.

Example 27 may include an apparatus for forming a semiconductor device, the apparatus comprising: means for forming a channel area above a substrate, wherein the channel area includes a first III-V material; means for forming a source area above the substrate, wherein the source area includes a second III-V material, an interface between the channel area and the source area includes the first III-V material; and means for forming a barrier layer within the source area, wherein the barrier layer includes a third III-V material, and a current is to flow between the source area and the channel area through the barrier layer.

Example 28 may include the apparatus of example 27 and/or some other examples herein, wherein the barrier layer includes a vertical part in parallel with a sidewall of the channel area.

Example 29 may include the apparatus of example 27 and/or some other examples herein, further comprising: means for forming a drain area above the substrate, wherein the drain area includes the second III-V material, and an interface between the channel area and the drain area includes the first III-V material, and means for forming a barrier layer within the drain area, wherein the barrier layer includes the third III-V material, and a current is to flow between the drain area and the channel area through the barrier layer.

Example 30 may include the apparatus of example 29 and/or some other examples herein, further comprising: means for forming a high-k gate dielectric layer on the channel area; means for forming a gate electrode separated from the channel area by the high-k gate dielectric layer; means for forming a source electrode coupled to the source area; and means for forming a drain electrode coupled to the drain area.

Example 31 may include the apparatus of any one of examples 27-28 and/or some other examples herein, further comprising: means for forming a sequence of barrier layers of the third III-V material within the source area, wherein the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

Example 32 may include the apparatus of any one of examples 27-28 and/or some other examples herein, wherein the third III-V material is different from the first III-V material, and the apparatus further includes: means for forming a first sequence of barrier layers of the first III-V material within the source area; and means for forming a second sequence of barrier layers of the third III-V material within the source area, wherein the current is to flow between the source area and the channel area through the first sequence of barrier layers and the second sequence of barrier layers.

Example 33 may include the apparatus of any one of examples 27-28 and/or some other examples herein, wherein the first III-V material, or the third III-V material includes In, P, Ga, or As.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   a channel area above the substrate and including a first III-V material, the channel area having an uppermost surface; and
   a source area above the substrate and including a second III-V material, wherein an interface between the channel area and the source area includes the first III-V material, the source area includes a barrier layer of a third III-V material above the substrate, and a current is to flow between the source area and the channel area through the barrier layer, wherein the barrier layer is laterally between the channel area and the second III-V material of the source area, wherein the barrier layer has an uppermost surface above the uppermost surface of the channel area, and wherein the barrier layer has a composition different than a composition of the second III-V material of the source area.

2. The semiconductor device of claim 1, wherein the barrier layer includes a vertical part in parallel with a sidewall of the channel area.

3. The semiconductor device of claim 2, wherein the barrier layer further includes a horizontal part in parallel to a surface of the substrate, and substantially orthogonal to the vertical part.

4. The semiconductor device of claim 3, further comprising:
   a source electrode coupled to the source area;
   a drain area above the substrate and including the second III-V material, wherein an interface between the channel area and the drain area includes the first III-V material, the drain area includes a barrier layer of the third III-V material above the substrate, and a current is to flow between the drain area and the channel area through the barrier layer;
   a drain electrode coupled to the drain area;
   a high-k gate dielectric layer on the channel area; and
   a gate electrode separated from the channel area by the high-k gate dielectric layer.

5. The semiconductor device of claim 1, wherein the source area further includes a sequence of barrier layers of the third III-V material, the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

6. The semiconductor device of claim 1, wherein the third III-V material is different from the first III-V material, the source area further includes a first sequence of barrier layers of the first III-V material and a second sequence of barrier layers of the third III-V material, the first sequence of barrier layers of the first III-V material interleaving with the second sequence of barrier layers of the third III-V material, and the current is to flow between the source area and the channel area through the first sequence of barrier layers and the second sequence of barrier layers.

7. The semiconductor device of claim 1, wherein the third III-V material is different from the first III-V material, the source area further includes a first sequence of barrier layers of the first III-V material and a second sequence of barrier layers of the third III-V material, each barrier layer of the second sequence of barrier layers of the third III-V material has a longer distance to the channel area than each barrier layer of the first sequence of barrier layers of the first III-V material, and the current is to flow between the source area and the channel area through the first sequence of barrier layers and the second sequence of barrier layers.

8. The semiconductor device of claim 1, wherein the channel area includes the first III-V material as an outer area of the channel area, and a fourth III-V material next to the first III-V material.

9. The semiconductor device of claim 1, wherein the channel area includes the first III-V material only.

10. The semiconductor device of claim 1, wherein the third III-V material is the same as the first III-V material.

11. The semiconductor device of claim 1, wherein the first III-V material or the third III-V material includes indium (In), phosphorus (P), gallium (Ga), or arsenic (As).

12. The semiconductor device of claim 1, wherein the source area includes n-type dopant.

13. The semiconductor device of claim 1, wherein the source area includes In, As, or Ga.

14. The semiconductor device of claim 1, wherein the substrate includes a high-resistivity p-type or n-type vicinal silicon material, germanium, germanium on silicon, gallium arsenide (GaAs), a silicon-on-insulator substrate, a Ge-on-insulator substrate, or an III-V on insulator substrate.

15. A method for forming a semiconductor device, the method comprising:
forming a channel area above a substrate, wherein the channel area includes a first III-V material, the channel area having an uppermost surface;
forming a source area above the substrate, wherein the source area includes a second III-V material, an interface between the channel area and the source area includes the first III-V material; and
forming a barrier layer within the source area, wherein the barrier layer includes a third III-V material, and a current is to flow between the source area and the channel area through the barrier layer, wherein the barrier layer is laterally between the channel area and the second III-V material of the source area, wherein the barrier layer has an uppermost surface above the uppermost surface of the channel area, and wherein the barrier layer has a composition different than a composition of the second III-V material of the source area.

16. The method of claim 15, wherein the barrier layer includes a vertical part in parallel with a sidewall of the channel area.

17. The method of claim 15, further comprising:
forming a drain area above the substrate, wherein the drain area includes the second III-V material, and an interface between the channel area and the drain area includes the first III-V material, and
forming a barrier layer within the drain area, wherein the barrier layer includes the third III-V material, and a current is to flow between the drain area and the channel area through the barrier layer.

18. The method of claim 17, further comprising:
forming a high-k gate dielectric layer on the channel area;
forming a gate electrode separated from the channel area by the high-k gate dielectric layer;
forming a source electrode coupled to the source area; and
forming a drain electrode coupled to the drain area.

19. The method of claim 15, further comprising:
forming a sequence of barrier layers of the third III-V material within the source area, wherein the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

20. The method of claim 15, wherein the third III-V material is different from the first III-V material, and the method further includes:
forming a first sequence of barrier layers of the first III-V material within the source area; and forming a second sequence of barrier layers of the third III-V material within the source area, wherein the current is to flow between the source area and the channel area through the first sequence of barrier layers and the second sequence of barrier layers.

21. The method of claim 15, wherein the first III-V material, or the third III-V material includes In, P, Ga, or As.

22. A computing device, comprising:
a processor; and
a memory device coupled to the processor, wherein the memory device or the processor includes a transistor comprising:
a substrate;
a channel area above the substrate and including a first III-V material, the channel area having an uppermost surface; and
a source area above the substrate and including a second III-V material, wherein an interface between the channel area and the source area includes the first III-V material, the source area includes a barrier layer of a third III-V material above the substrate, and a current is to flow between the source area and the channel area through the barrier layer, wherein the barrier layer is laterally between the channel area and the second III-V material of the source area, wherein the barrier layer has an uppermost surface above the uppermost surface of the channel area, and wherein the barrier layer has a composition different than a composition of the second III-V material of the source area.

23. The computing device of claim 22, wherein the source area further includes a sequence of barrier layers of the third III-V material, the current is to flow between the source area and the channel area through the sequence of barrier layers, a first barrier layer in the sequence of barrier layers has a smaller thickness than a second barrier layer in the sequence of barrier layers when the first barrier layer has a longer distance to the channel area than the second barrier layer, and a first quantum well between two barrier layers in the sequence of barrier layers has a larger width than a second quantum well when the first quantum well has a longer distance to the channel area than the second quantum well.

24. The computing device of claim 22, wherein the third III-V material is different from the first III-V material, the source area further includes a first sequence of barrier layers of the first III-V material and a second sequence of barrier layers of the third III-V material, and the current is to flow between the source area and the channel area through the first sequence of barrier layers and the second sequence of barrier layers.

25. The computing device of claim 22, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

* * * * *